US005304815A

United States Patent [19]

Suzuki et al.

[11] Patent Number: 5,304,815

[45] Date of Patent: Apr. 19, 1994

[54] ELECTRON EMISSION ELEMENTS

[75] Inventors: Akira Suzuki, Yokohama; Takeo Tsukamoto, Atsugi; Akira Shimizu, Inagi; Masao Sugata, Yokohama; Isamu Shimoda, Zama; Masahiko Okunuki, Tokyo, all of Japan

[73] Assignee: Canon Kabushiki Kaisha, Tokyo, Japan

[21] Appl. No.: 94,404

[22] Filed: Jul. 21, 1993

Related U.S. Application Data

[63] Continuation of Ser. No. 759,200, Sep. 11, 1991, abandoned, which is a continuation of Ser. No. 595,668, Oct. 11, 1990, abandoned, which is a continuation of Ser. No. 298,308, Jan. 18, 1989, abandoned, which is a continuation of Ser. No. 94,429, Sep. 9, 1987, abandoned.

[30] Foreign Application Priority Data

| | | | |
|---|---|---|---|
| Sep. 11, 1986 | [JP] | Japan | 61-212821 |
| Oct. 3, 1986 | [JP] | Japan | 61-234501 |
| Dec. 1, 1986 | [JP] | Japan | 61-284240 |
| Dec. 16, 1986 | [JP] | Japan | 61-297683 |
| Jan. 30, 1987 | [JP] | Japan | 62-018191 |

[51] Int. Cl.[5] .................... H01L 27/14; H01L 31/00; H01J 29/12

[52] U.S. Cl. .................................... 257/10; 257/435; 257/462; 359/71; 313/465; 313/501; 313/524; 250/214 VT

[58] Field of Search .................... 357/30, 30 R, 30 C, 357/31, 32; 313/542, 366, 367, 524, 465, 501; 350/333, 330, 336, 342; 250/492.24, 213 VT; 359/70, 54, 71; 257/10, 435, 462

[56] References Cited

U.S. PATENT DOCUMENTS

| | | | |
|---|---|---|---|
| 3,119,947 | 1/1964 | Goetzberger | 313/346 |
| 3,575,629 | 4/1971 | O→Keefe | 313/542 |
| 3,624,273 | 11/1971 | Gale | 178/5.4 R |
| 3,644,770 | 2/1972 | Bell | 313/542 |
| 3,872,489 | 3/1975 | Hagenlocher | 357/15 |
| 3,884,733 | 5/1975 | Bean | 313/367 |
| 4,015,284 | 3/1977 | Hara et al. | 357/61 |
| 4,370,797 | 2/1983 | von Gorkom et al. | 313/366 |
| 4,422,729 | 12/1983 | Suzuki et al. | 350/336 |
| 4,581,476 | 4/1986 | Yamazaki | 357/30 |
| 4,626,885 | 12/1986 | Ishioka et al. | 357/31 |
| 4,686,556 | 8/1987 | Dietrich | 357/30 |
| 4,698,496 | 10/1987 | Dolizy | 313/524 |

FOREIGN PATENT DOCUMENTS

| | | | |
|---|---|---|---|
| 0041119 | 12/1981 | European Pat. Off. | |
| 3313900 | 10/1984 | Fed. Rep. of Germany | 313/542 |
| 1460237 | 12/1965 | France | |
| 2235496 | 6/1974 | France | |
| 47-33537 | 8/1972 | Japan | 313/542 |
| 1023257 | 3/1966 | United Kingdom | |
| 1117759 | 6/1968 | United Kingdom | |
| 1445204 | 8/1976 | United Kingdom | |

OTHER PUBLICATIONS

"Lexikon Elektronik"; Herausgegeben vaon Dr.-Ing. Hans-Dieter Junge; Physik Verlag; pp. 215-219.

*Primary Examiner*—Jerome Jackson

*Attorney, Agent, or Firm*—Fitzpatrick, Cella, Harper & Scinto

[57] ABSTRACT

An electron emission element comprises a P-type semiconductor substrate and electrodes formed on both ends of the semiconductor substrate. A voltage is applied between said electrodes. The P-type semiconductor substrate is irradiated with light to emit the electrons, generated in the P-type semiconductor substrate by photoexcitation, from an electron emitting face at an end of the P-type semiconductor substrate.

12 Claims, 6 Drawing Sheets

ELECTRON EMISSION ELEMENTS

This application is a continuation of application Ser. No. 07/759,200 filed Sep. 11, 1991, now abandoned which is a continuation of application Ser. No. 07/595,668 filed Oct. 11, 1990 abandoned, which is a continuation of application Ser. No. 07/298,308 filed Jan. 18, 1989, abandoned which is a continuation of 07/094,429 filed Sep. 9, 1987 abandoned.

BACKGROUND OF THE INVENTION

1. Field of the Invention

The present invention relates to an electron emission element.

2. Related Background Art

There are already known various electron emission elements, such as an element utilizing an avalanche phenomenon of a PN junction, one utilizing electron injection into a P-layer of a PN junction under forward bias, one having a thin insulator sandwiched between metal layers (MIM structure), and ones utilizing electric field emission or surface conduction.

However, in these known elements, in which electrons of high energy are electrically generated and emitted, the electron emission can only be controlled electrically, and it has not been possible to correlate the electron emission with light.

SUMMARY OF THE INVENTION

The object of the present invention is to provide an electron emission element allowing electron emission control with light.

According to an embodiment of the present invention, there is provided an electron emission element having electrodes on both sides of a P-type semiconductor substrate, wherein a voltage is applied across said electrodes and the electrons generated in said P-type semiconductor substrate are emitted from an electron emitting face at an end of said substrate. Said element allows electron emission control by light, and can be easily produced because of an extremely simple structure composed of the P-type semiconductor and electrodes only.

According to another embodiment of the present invention, there is provided an electron emission device comprising an array of plural sets of an electron emission element in which the electron emission is triggered by light irradiation and a shutter element for controlling the light irradiation to said electron emission element. The plural electron emission elements can be given a relatively low uniform voltage. Therefore the emission elements can be constructed in very simple manner, and can be arranged with a high density, thus providing an output pattern of high density pixels.

In another embodiment of the present invention, there is provided an MIM electron emission element of a simple structure, allowing electron emission control by light and also allowing an integration. This photo-induced electron emission element is provided with a transparent electrode formed on a translucent substrate; a photoelectric converting junction area formed by superposing a semiconductor area of a conductive type, a semiconductor area of an opposite conductive type, and a conductive area in succession on said transparent electrode; an insulating area provided on said photoelectric converting junction area; and a metal layer provided on said conductive area across said insulating area and having a recess on said conductive area. In this manner the photoelectric converting junction area composed of the semiconductor area of a conductive type, semiconductor area of opposite conductive type, and conductive area superposed on the transparent electrode, is unified, on the transparent substrate, with an MIM electron emission element composed of said conductive area, insulting area and metal layer. Also the electrode of the photoelectric converting junction area and the conductive area of the MIM electron emission element are used commonly, and an insulating area is provided for electric insulation, and there is thus reached a simple structure enabling integration. Also said photoelectric converting junction area is formed only under the recess of the metal layer, constituting the electron emitting portion of the MIM electron emission element, thereby achieving efficient electron emission.

If an area of material for lowering the work function is provided in said recess, it is possible to emit the electrons from the metal layer with a lower energy, thereby further improving the efficiency of electron emission.

According to another embodiment of the present invention, the electron emission element is provided with a transparent electrode, a P-type semiconductor area formed on said transparent electrode, and an electrode formed on said P-type semiconductor area, whereby a voltage is applied across said transparent electrode and said electrode, and light is irradiated through said transparent electrode, thereby emitting the electrons generated in said P-type semiconductor from an electron emitting face at an end of said semiconductor area. It is extremely simple in structure, consisting of the P-type semiconductor area and electrodes and allowing light irradiation through the transparent electrode, thereby enabling easy manufacture and high integration.

It is also possible, by forming a recess in said electrode and forming an area of material reducing the work function therein, to emit the electrons with a lower energy and to improve the efficiency of electron emission.

It is also possible, by providing plural P-type semiconductor areas on a same transparent electrode and by providing aforementioned electrodes on said P-type semiconductor areas while forming insulating areas between said P-type semiconductor areas, to control the electron emission from each P-type semiconductor area by on-off control of said electrode or irradiating light. In this manner a dot shaped or linear electron emission source can be obtained.

It is furthermore possible, by arranging said transparent electrodes and said electrodes in a matrix structure and forming said P-type semiconductor areas in crossing points while forming insulating areas between neighboring P-type semiconductor areas, to control the electron emission from each P-type semiconductor area by on-off control of corresponding transparent electrode and electrode or of irradiating light. In this manner a dot-shaped, linear or planar electron emission source can be obtained.

According to another embodiment of the present invention, there is provided a photoswitchable electron emission element in which the amount of electrons emitted by an MIM electron emission element is controllable with light and which enables a compact designing with a laminate structure. Said photoswitchable electron emission element is provided with a photoelectric converting junction element having at least a semiconductor area of a conductive type and a semiconductor area of an opposite conductive type, and an electron emission element which is formed on said photoelectric converting junction element and which has a sandwich structure of a conductive material and a metal across an insulating material, for electron emission from the surface of said metal by a voltage applied across said conductive material and said metal. Said photoswitchable electron emission element effect photoelectric conversion of the incident light by means of said photoelectric converting junction element, and injects the resulting current into the electron emission element formed on said junction element to cause electron emission corresponding to said current.

A PIN photodiode may be used for said photoelectric converting junction element, and the presence of an intrinsic layer allows reducing junction capacity and allows the use of a high voltage for reducing the transit time of carriers in the depletion layer, thereby enabling high-speed operation.

In addition there may be employed an avalanche photodiode as the photoelectric converting junction element to achieve an electron multiplying function by the avalanche phenomenon in addition to the above-mentioned high-speed function, thereby providing a photoswitchable electron emission element with an interminal amplifying effect.

DETAILED DESCRIPTION OF THE PREFERRED EMBODIMENTS

Now the present invention will be explained by embodiments thereof shown in the attached drawings.

Figure 1:
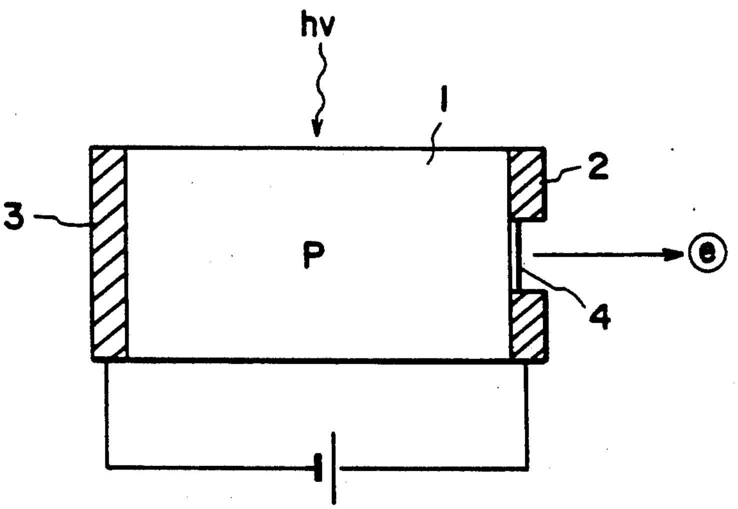
FIG. 1 is a schematic cross-sectional view of an electron emission element constituting a first embodiment of the present invention.

FIG. 1 is a schematic cross-sectional view of an electron emission element constituting a first embodiment of the present invention.

On both ends of a P-type semiconductor substrate 1 attached are metal electrodes 2, 3, and an electron emission aperture is formed in the metal electrode 2. On the P-type semiconductor substrate 1 in said electron emission aperture there is formed a layer 4 of a material for reducing the work function, such as Cs or CsO.

In such structure, a driving voltage is applied across the electrodes 2, 3 with a positive side at the electrode 2, and the p-type semiconductor substrate 1 is irradiated with light $h\nu$. If $h\nu \geqq Eg$ which is the band gap of the semiconductor, the electrons are excited to the conduction band, accelerated by the electric field and emitted from the surface of the work function reducing material 4. A high electron emission efficiency can be achieved if the practical work function is reduced, by the work function reducing material 4, to a level lower than the conduction band of the semiconductor, namely a state of negative electron affinity.

Also, since electron emission does not occur in the absence of light irradiation, a high-speed photoswitching operation can be achieved in which the electron emission is turned on or off by the on-off control of light.

Figure 2:
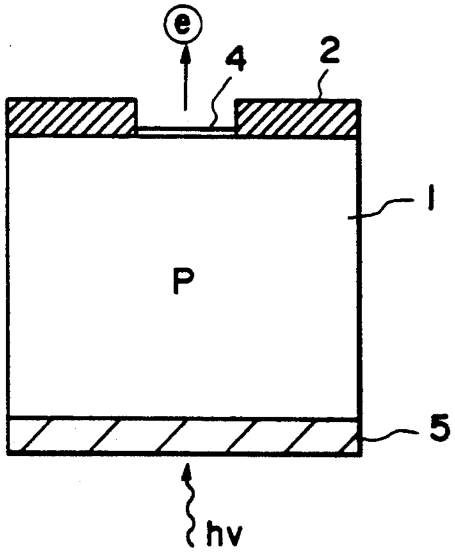
FIG. 2 is a schematic cross-sectional view of an electron emission element constituting a second embodiment of the present invention.

FIG. 2 is a schematic cross-sectional view of a second embodiment of the present invention.

One of the electrodes formed on a P-type semiconductor substrate 1 is composed of a transparent electrode 5, for example of ITO, through which light is introduced. Thus the electrons are excited in the semiconductor substrate 1 as explained above, accelerated to the electrode 2 and emitted from the surface of the layer 4 of the work function reducing material.

In the present embodiment there is shown only one electron emission element, but the present invention is not limited to such embodiment. For example it is possible to easily produce an electron emission device having an array of plural electron emission elements, by forming a transparent electrode 5 on a glass substrate, then forming plural P-type semiconductor substrates 1 in the form of islands or in mutually insulated forms, and forming electrodes 2 with electron emission apertures and layers of work function reducing material respectively corresponding to said semiconductor substrates 1.

Figure 3:
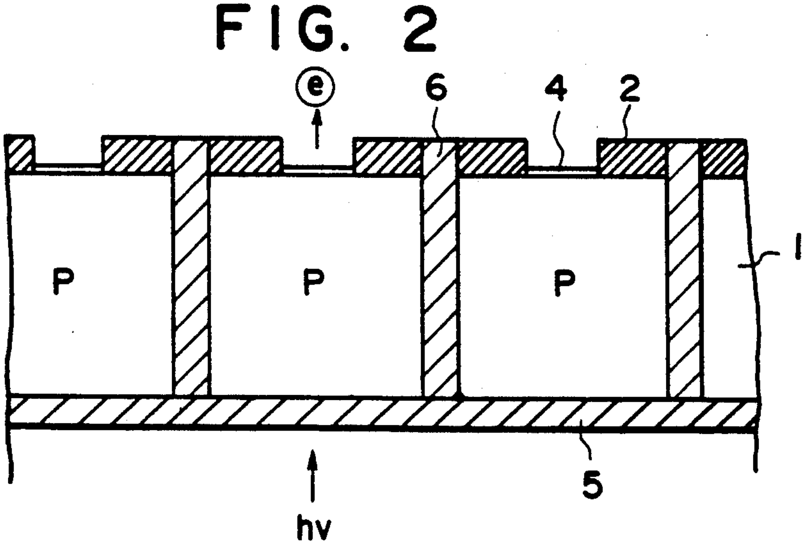
FIG. 3 is a schematic view of a third embodiment of the present invention.

FIG. 3 is a schematic view of a third embodiment of the present invention.

In this embodiment, the electron emission elements shown in FIG. 2 are formed on a transparent substrate, and are mutually separated by insulating opaque layers 6. Thus said electron emission elements can be independently driven by the independent on-off control of the lights entering said elements. Also the electron emission efficiency can be controlled by regulating the energy of the incident light.

As explained in the foregoing, the electron emission element of the present embodiment easily enables electron emission control with light, such as photoswitching operation. Also an extremely simple structure consisting solely of P-type semiconductor and electrodes enables easy manufacture of even an array of plural elements.

In the following there will be explained, as a fourth embodiment of the present invention, an electron emission device having plural electron emission elements and usable as a pattern generator for a display device.

As an electron source there has been utilized thermal electron emission from a heated cathode. However the electron emission element utilizing such heated cathode has been associated with the drawbacks of a large energy loss in heating, necessity of heating means, and inability for immediate function after switching on, due to considerable time required for pre-heating.

For this reason various electron emission elements not relying on heating have been developed and proposed.

For example there are already proposed an element in which an inverse bias voltage is applied to a PN junction to emit electrons from the element by electron avalanche yield phenomenon; an MIM element having a metal layer-insulator-metal layer structure in which a voltage is applied between said two metal layers to emit the electrons, which have passed the insulator by tunnel effect, from the metal layer to outside; a surface conduction element (SCE) in which a voltage is applied perpendicularly to a thin high resistance layer to emit the electrons from the surface of said thin layer to outside; and a field effect (FE) element in which a voltage is applied to a metal of a form facilitating the concentration of electric field to create a local high-density electric field thereby emitting the electrons from said metal.

As an application of such electron emission elements, plural elements are arranged two-dimensionally and are suitably on-off controlled to emit the electrons in a desired pattern, and the emitted electrons are accelerated and deflected toward a fluorescent surface to obtain a display.

In such electron emission elements, the electron emission is generated by applying a voltage exceeding a threshold value. Thus, if a device for patterned electron emission is formed by an array of a plurality of the electron emission elements, it becomes necessary to attach a wire for voltage control for each element. Consequently the density of arrangement of the elements becomes lower, so that a pattern of high-density pixels is difficult to achieve.

The present embodiment is to resolve such drawbacks.

Figure 4A:
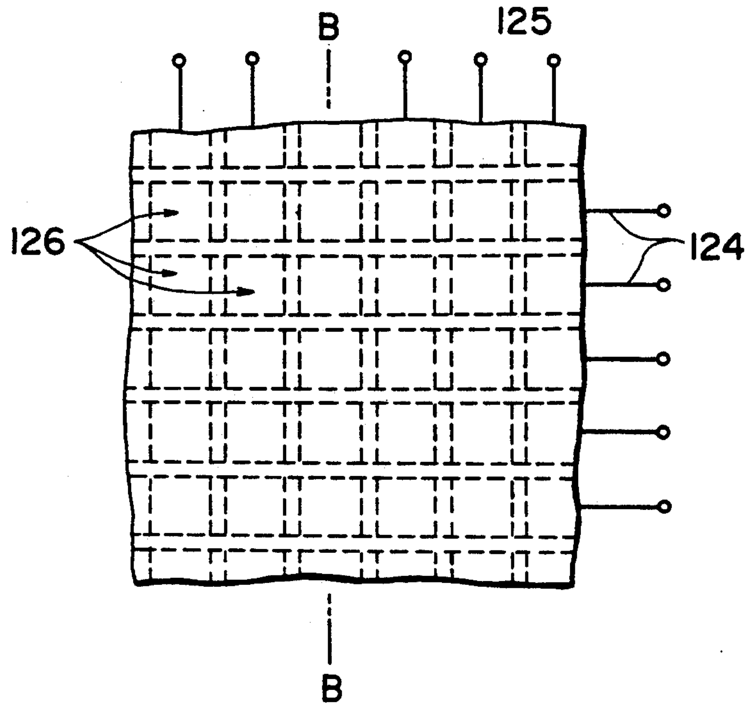
FIG. 4A is a partial plan view of an electron emission device constituting a fourth embodiment.
Figure 4B:
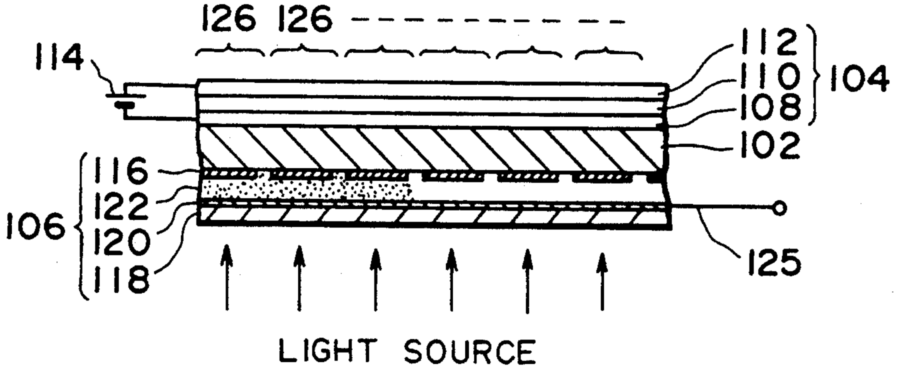
FIG. 4B is a cross-sectional view thereof along a line B—B.

FIG. 4A is a partial plan view of an electron emission device constituting a fourth embodiment of the present invention, and FIG. 4B is a cross-sectional view along a line B—B.

In these figures there are shown a substrate 102, an MIM structure 104, and a light shutter 106.

The substrate 102 is transparent, and is composed, for example, of glass, ceramics, or an insulating crystal such as GaAs, GaSb, InAs, GaP or spinell ($MgAl_2O_4$).

The MIM structure 104 has a first metal layer 108, an insulator layer 110 and a second metal layer 112. The first metal layer 108 is composed for example of Al, Be, Mo, Pt, Ta, Au, Ag, W, Cr, Mg or nichrome. Said metal layer 108 should preferably be as thin as possible, for example in a range of 0.001 to 1 μm, in order that the electrons excited by the light irradiation from below can be efficiently supplied to the insulator layer 110.

The insulator layer 110 is composed for example of $SiO_2$, $Ta_2O_5$, $Al_2O_3$, BeO, SiC, $SiO_xN_yH_z$, $SiN_xH_y$ or AlN. The thickness of said insulator layer 110 is preferably small as long as the destruction of insulation does not occur, but is suitably selected in consideration of the insulating material used in said layer 110 and the metal employed in the second metal layer 112 to achieve a desired electron emission characteristic, for example in a range of 10–2000Å.

The second metal layer 112 is composed for example of Au, Pt, Al or Ag. Said second metal layer 112 is preferably as thin as possible, for example in a range of 100–3000Å, in consideration of the electron emission efficiency.

As shown in FIG. 4B, a power source 114 is provided for applying a voltage between the first metal layer 108 and the second metal layer 112, with positive side at the second metal layer 112.

The shutter 106 is provided with a first transparent electrode 116 formed on the lower face of the substrate 102; a transparent plate 118 positioned opposite to said substrate 102; a second transparent electrode layer 120 formed on said transparent plate so as to face said first transparent electrode layer 116; and a liquid crystal layer provided between said substrate 102 and transparent plate 118. The first transparent electrodes 116 extend in a direction perpendicular to the line B—B and are arranged in parallel manner with a suitable pitch. Similarly the second transparent electrodes 120 extend along the line B—B and are arranged in parallel manner with a suitable pitch. Each first electrode 116 is connected to a terminal 124 for applying the driving voltage, and each second electrode 120 is connected to a similar terminal 125.

Thus there is formed a unit area 126 for independent voltage application by so-called matrix drive, at the crossing position of each first electrode 116 and each second electrode 120 of the shutter 106.

Each unit area 126 in the above-explained MIM structure 104 corresponding to an electron emission element of the present invention, and each unit area 126 of the shutter 106 corresponds to a shutter element in the present invention.

As shown in FIG. 4B, a light source is provided for illuminating the shutter 106 through the transparent plate 118.

The device of the present embodiment is driven in the following manner.

In the MIM structure 104, a voltage is applied by the power source 114 between the first metal layer 108 and the second metal layer 112. The voltage of said power source 114 is suitably determined according to the specific parameters of the MIM structure and the desired electron emission characteristic, but is selected at such a level that said second metal layer 112 does not emit electrons solely by the voltage from said power source 114, for example in a range from 3 to 20 V.

In the shutter 106, in a unit area 126 not subjected to voltage application between the first electrode 116 and the second electrode 120, the liquid crystal layer 122 remains transparent whereby the light from the light source is transmitted, through the substrate 102, to the MIM structure, Consequently, in said unit area, the electrons in the first metal layer 108 of the MIM structure 104 are subjected to the energy of irradiating light, pass through the insulator layer 110 easily by the voltage applied by said power source 114, and are emitted through the second metal layer 112 to the outside.

On the other hand, in each unit area 126 of the shutter 106 subjected to the voltage application between the first electrode 116 and second electrode 120, the liquid crystal layer 122 becomes light-scattering, so that the light from the light source is mostly scattered and scarcely reaches the MIM structure through the substrate 102. Therefore no electron emission takes place from the MIM structure in such unit area.

As explained above, the device of the present embodiment only requires application of a common voltage to all the electron emission elements, and the electron emission can be obtained from desired unit areas 126 by matrix voltage application to the shutter elements. The voltage applied to the electron emission element may be selected smaller or larger as the intensity of light source becomes lower or higher, respectively.

Figure 5:
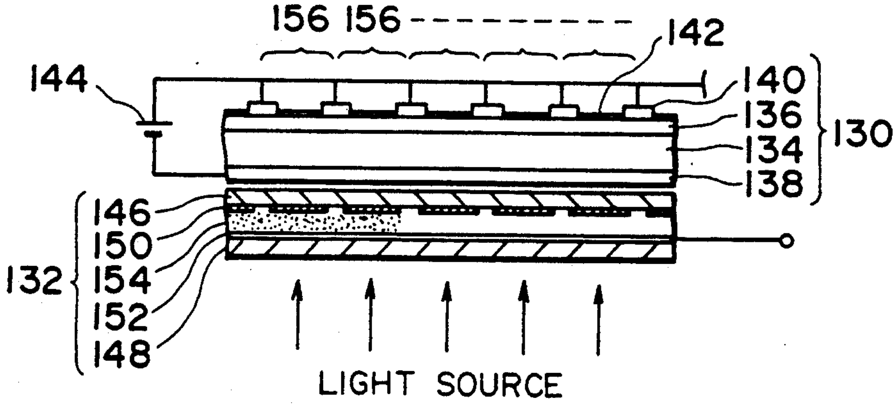
FIG. 5 is a partial cross-sectional view of an electron emission device constituting a fifth embodiment.

FIG. 5 is a partial cross-sectional view of a fifth embodiment of the present invention, showing a similar part as shown in FIG. 4B.

In FIG. 5 there are shown a PN junction 130, and a light shutter 132.

The PN junction has an N-type semiconductor layer 134, a P-type semiconductor layer 136, a first electrode layer 138, and a second electrode layer 140. The N-type semiconductor layer 134 has a thickness for example in a range of 0.001 to 1 μm, while the P-type semiconductor layer 136 has a thickness for example in a range of 0.001 to 1 μm. The first electrode 138 is substantially transparent. Such transparent electrode can be realized by suitable selection of material and thickness. Said first electrode 138 is for example composed of ITO, $SnO_2$ or ZnO and has a thickness for example of 100 to 3000Å. The second electrode 140 covers a part of the P-type semiconductor layer 136, the remaining part of which is coated with an alkali metal such as Cs or another compound in order to facilitate electron emission.

As shown in FIG. 5, a power source 144 is provided to apply a voltage between the first electrode 138 and the second electrode 140, with the positive side at the second electrode 140.

The shutter 132 is basically same as the shutter in the foregoing fourth embodiment, and is composed of two transparent plates 146, 148 positioned in mutually opposed relationship; a first electrode layer 150 and a second electrode layer 152 respectively formed on mutually opposed faces of said plates; a liquid crystal layer 154 provided between said transparent plates 146, 148; and voltage applying terminals connected to said first and second electrodes 150, 152.

In the present embodiment, the area coated with the material 142 such as Cs corresponds to the unit area 156 formed at the crossing point of each first electrode 150 and each second electrode 152 in the shutter 106.

The device of the present embodiment is driven in the same manner as in the fourth embodiment. The voltage applied across the PN junction 130 is selected at such level that the PN junction does not emit the electrons toward above in the absence of light irradiation to said junction, but emits the electrons only in the presence of light irradiation. In the present embodiment the electrons are emitted from the coated area of the material 142 such as Cs.

The foregoing embodiments employ a liquid crystal shutter, but the device of the present invention may utilize other shutters utilizing electrooptical crystals such as PLZT, lithium niobate ($LiNbO_3$) or lithium tantalate ($LiTaO_3$).

Also in the foregoing embodiments there have been disclosed an electron emission element having an MIM structure and an element utilizing negative electron affinity of a PN junction, but there can also be utilized, in the device of the present invention, an element in which a reverse bias voltage is applied to a PN junction and an electron avalanche yield is induced by light irradiation, or an element in which a P-layer is photoexcited in an NPP+ structure.

As explained in the foregoing, in the present embodiment, the plural electron emission elements only requires a relatively low common voltage, so that said elements can be constructed in simple manner and arranged with a high density, thus enabling the formation of a pattern with high-density pixels.

In the following there will be explained a sixth embodiment of the present invention.

Figure 6:
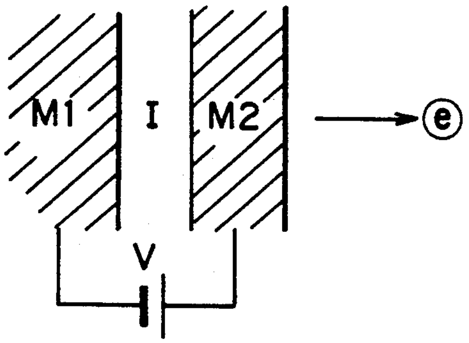
FIG. 6 is a schematic view showing a general structure of an MIM electron emission element.

FIG. 6 schematically shows a general structure of an MIM electron emission element.

The MIM electron emission element is composed of a metal M1, a thin insulating layer I formed thereon, and a thin metal M2. Under the application of a voltage V, larger than the word function $\phi_m$ of the metal M2, between the metals M1, M2, the electrons which have passed the insulating layer I by tunnel effect and having an energy larger than the vacuum level are emitted from the surface of the metal M2.

In order to obtain a high electron emission efficiency in such element, the insulating layer I should be formed as thin as possible within an extent not causing destruction of insulation, and the metal M2 should also be formed as thin as possible within an extent allowing sufficient current flow.

Figure 7:
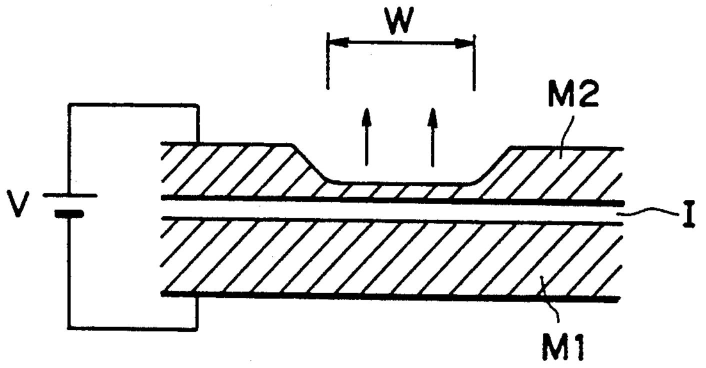
FIG. 7 is a schematic cross-sectional view of a conventional MIM electron emission element.

FIG. 7 is a schematic cross-sectional view of a conventional MIM electron emission element, wherein the metal M2 is formed thinner in an electron emitting area W to improve the electron emission efficiency.

The present embodiment is to enable control by light of the quantity of electron emission from such MIM electron emission element and to realize a simple structure enabling high integration.

Figure 8A:
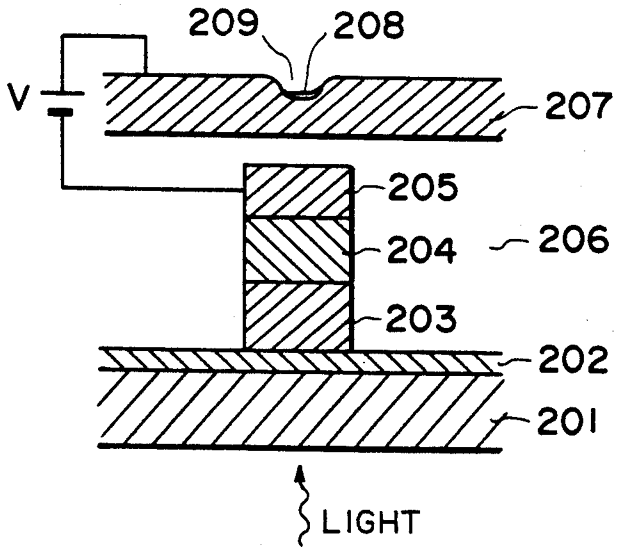
FIG. 8A shows a schematic cross-sectional view of the basic structure of photo exciting electron emission element according to sixth embodiment of the present invention.
Figure 8B:
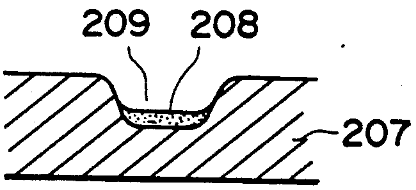
FIG. 8B shows an expanded cross-sectional view of a recess in the metal layer in FIG. 8A.

FIG. 8A is a schematic partial cross-sectional view showing the basic structure of a photoexciting electron emission element of the present embodiment, and FIG. 8B is a cross-sectional view of a recess in the metal layer.

Referring to FIG. 8A, a translucent substrate 201 such as glass is provided thereon with a transparent electrode 202 composed for example of ITO, on a part of which there are formed, in succession, an N-type semiconductor area 203, a P-type semiconductor area 204, and a conductive area 205 composed of metal such as Al or semiconductor such as Si. The transparent electrode 202, N-type semiconductor area 203, P-type semiconductor area 204 and conductive area 205 constitute a photoelectric converting junction area.

On said conductive area 205 and at the side of the photoelectric converting junction area, there is formed an insulating area 206, which is advantageously composed of $SiO_2$ in case the conductive area 205, P-type semiconductor area 204 and N-type semiconductor area 203 are composed of Si. On said insulating area 206 there is formed a metal layer 207 for example of Al, Au or Pt, which has a recess 209 in an area above said photoelectric converting junction area. In said recess 209 there is formed an area 208 of a work function reducing material composed for example of an alkali metal or alkali earth metal such as Cs. The conductive area 205, insulating area 206 and metal layer 208 constitute an MIM electron emission element.

In the present embodiment the conductive area 205 serves as an electrode of the photoelectric converting junction area and also as the conductive layer of the MIM electron emission element, thus simplifying the entire structure. The insulating area 206 serves as the insulating layer of the MIM electron emission element, and also insulates the lateral faces of the photoelectric converting junction area, thus preventing the deterioration of characteristic by current leak. Also in the present embodiment the photoelectric converting junction area for the photoelectric conversion and the MIM electron emission element for electron emission are mutually superposed and unified to enable high integration, and said junction area is formed only under the recess for electron emission, thereby improving the efficiency thereof. Besides said efficiency is further improved by the presence of area of the work function reducing material 208 in the recess 209. It is therefore possible to produce, in integrated manner, photoexcitable electron emission elements having plural electron sources such as an image sensor.

In the present embodiment of the above-explained structure, a voltage V is applied between the conductive area 205 and the metal layer 207, and the photoelectric converting junction area is irradiated with light through the translucent substrate 201, thus a photoelectromotive force is generated between the P-type semiconductor area 204 and the N-type semiconductor area 203, to inject the electrons into the conductive area 205 constituting the MIM electron emission element, and the electrons which have passed the insulating area 206 are emitted from the recess 209 in which the work function of the metal layer 207 is lowered by the work function reducing material 208. In this manner efficient electron emission is made possible with a lower energy than in the prior technology.

Figure 9:
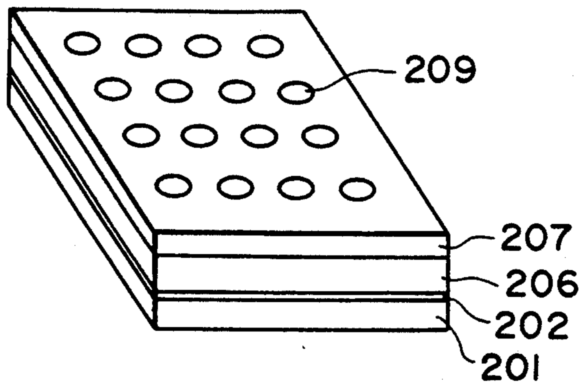
FIG. 9 is a schematic view showing the structure of a photoinduced electron emission element of said sixth embodiment.

FIG. 9 is a schematic view showing detailed structure of the photoexcitable electron emission element of the present embodiment.

As shown in FIG. 9, the metal layer 207 is provided with plural recesses 209, for each of which there are provided an MIM electron emission area and a converting junction area. The pitch of the recesses 209 can be as small as the order of micrometer.

As explained in the foregoing, the photoexcitable electron emission element of the present embodiment is featured by a unified structure of a photoelectric converting junction area and an MIM electron emission element wherein a conductive area is commonly used as the electrode of said photoelectric converting junction area and that of the MIM electron emission element and an insulating area is formed for electric insulation, so that a simple structure enabling high integration can be obtained. Also the photoelectric converting junction area is formed only below the recess of the metal layer constituting the electron emitting portion of said MIM electron emission element to achieve efficient electron emission. Thus it is possible to produce integrated photoexcitable electron emission elements provided with plural photoelectron emission sources such as an image sensor.

Said recess may be provided with an area of a work function reducing material for emitting the electrons from the metal layer with a lower energy, thereby improving the efficiency of electron emission.

In the following there will be explained a seventh embodiment of the present invention.

Figure 10A:
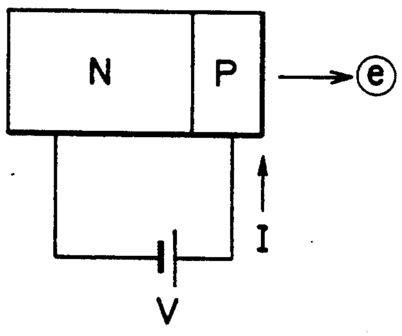
FIG. 10A is a schematic view of an electron emission element in which a forward bias is applied to a PN junction and electrons are injected into the P-layer.
Figure 10B:
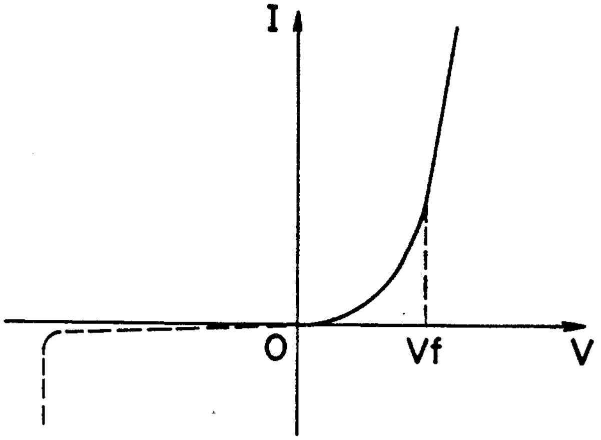
FIG. 10B is a chart schematically showing current-voltage characteristic thereof.

FIG. 10A is a schematic view of an electron emission element in which a forward bias voltage is applied to a PN junction to inject electrons into the P-layer, and FIG. 10B is a schematic chart showing the current-voltage characteristic thereof.

In FIG. 10A, a forward bias voltage V applied to the Pn junction induces a forward current I as shown in FIG. 10B, whereby a part of electrons injected from the N-layer into the P-layer is emitted into the vacuum from the surface of the P-layer. The surface of said P-layer is coated for example with Cs in order to reduce the work function thereby increasing the quantity of the electrons emitted.

Figure 11:
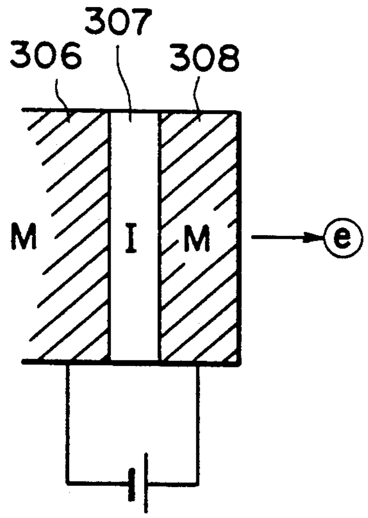
FIG. 11 is a schematic view of an MIM electron emission element.
Figure 12:
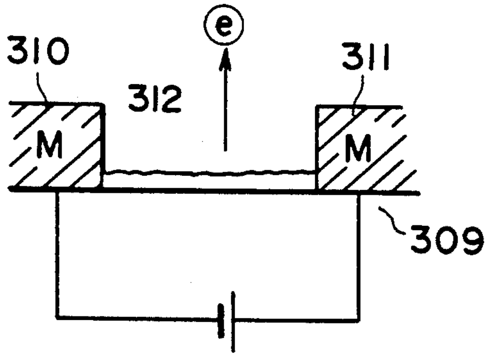
FIG. 12 is a schematic view of a surface conduction type electron emission element.

FIG. 11 is a schematic view of an MIM electron emission element, and FIG. 12 is a schematic view of a surface conduction electron emission element.

The MIM electron emission element has a laminate structure composed of a metal electrode 306, an insulating layer 307 and a thin metal electrode 308, and the electrons are emitted from the thin metal electrode 308, by a voltage application between the electrodes 306 and 308.

The surface conduction electron emission element is composed of electrodes 310, 311 formed on an insulating substrate 309, and a high-resistance thin film 312 formed therebetween. A voltage application between the electrodes 310, 311 induces electron emission from the surface of said high-resistance thin film 312.

However, in such known elements, in which electrons of high energy are electrically generated and emitted, the electron emission can only be controlled electrically, and it has not been possible to correlate the electron emission with light.

The present embodiment aims at an electron emission element characterized by a simple structure allowing integration, and allowing electron emission control with light.

In the following description reference is to be made to FIG. 2, as the basic structure of the present embodiment is similar to that shown in FIG. 2.

On a transparent electrode 5 composed for example of ITO there are provided a P-type semiconductor area 1 and a metal electrode 2 having an electron emitting aperture A layer 4 of a work function reducing material such as Cs or CsO is formed on the surface of the P-type semiconductor area in said aperture.

In an electron emission element of such structure, the P-type semiconductor area is irradiated by light $h_\nu$ through the transparent electrode 5, and a voltage is applied between the transparent electrode 5 and the metal electrode 2, with the positive side at the metal electrode 2. If $h_\nu \geqq Eg$ which is the band gap of the semiconductor, the electrons are excited to the conduction band by the light, accelerated by the electric field and emitted from the surface of the layer of work function reducing material. The presence of said layer 4 of the work function reducing material lowers the practical work function to a level lower than the conduction band of the P-type semiconductor area, or a state of negative electron affinity (NEA), thereby achieving a high electron emission efficiency.

The electron emission is not induced if a voltage is not applied between the transparent electrode 5 and the electrode 2 even in the presence of irradiating light, or if the irradiating light is not present even in the presence of said voltage. Thus the amount of electron emission can be controlled either by the voltage applied to the P-type semiconductor area or by the irradiating light $h_\nu$.

Also said control may be achieved by the combination of the applied voltage and the irradiating light.

Figure 13:
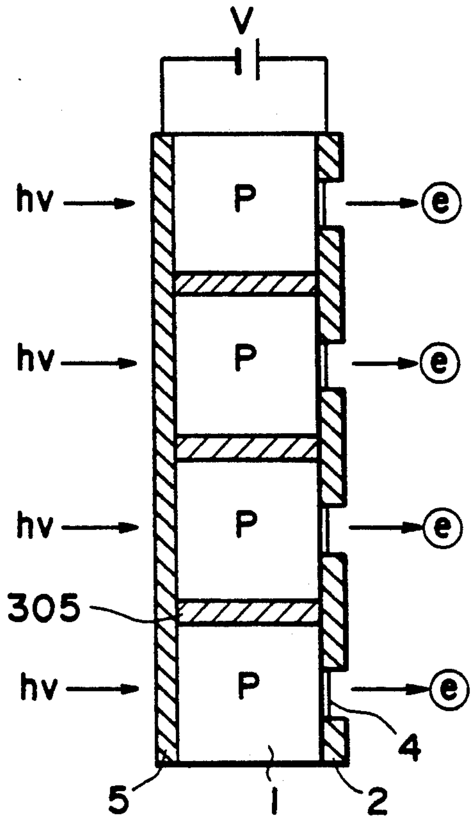
FIG. 13 is a schematic cross-sectional view showing the structure of an electron emission element constituting a seventh embodiment.

FIG. 13 is a schematic cross-sectional view of an embodiment of the electron emission element of the present invention, wherein same components as those in FIG. 2 are represented by same numbers.

As shown in FIG. 13, on a transparent electrode 5, there are provided plural P-type semiconductor areas 1 mutually separated by opaque insulating areas 305. Then an electrode 2 is provided thereon, and layers 4 of a work function reducing material are formed respectively corresponding to said P-type semiconductor areas.

In such electron emission element, a voltage V is applied between the transparent electrode 5 and the electrode 2 with the positive side at the electrode 2, and desired P-type semiconductor areas 2 are irradiated with light, whereby the electrons are emitted only from the layers 4 of work function reducing material of thus irradiated P-type semiconductor areas. Consequently each electron emission source can be independently controlled by the on-off control of the light entering each P-type semiconductor area, and dot-shaped or linear electron emission source can therefore be obtained.

Also the independent control of the electron emission sources can be achieved by irradiating the P-type semiconductor areas with constant light, dividing the electrode 2 corresponding to the P-type semiconductor areas 1 and on-off controlling the voltage supplied thereto. Also the on-off control may be achieved by the combination of the applied voltage and the irradiating light.

Figure 14:
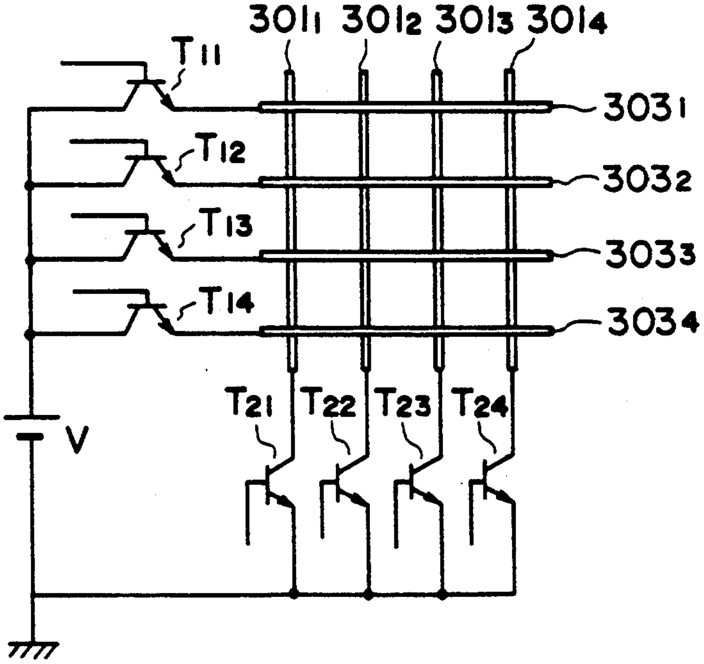
FIG. 14 is a schematic view showing another embodiment of the electron emission element of the present invention.

FIG. 14 is a schematic view showing the function of another embodiment of the electron emission element of the present invention. The structure of the element is same as that shown in FIG. 13 and will not therefore be explained in detail.

In the present embodiment transparent electrodes $301_1$–$301_4$ and electrodes $303_1$–$303_4$ are made to cross each other to form a matrix, and a P-type semiconductor area (not shown) is formed at each crossing point. A voltage V can be applied to desired P-type semiconductor areas by applying said voltage to desired transparent electrodes $301_1$–$301_4$ and desired electrodes $303_1$–$303_4$ through the control transistors T21–T24 and T11–T14.

As in the foregoing embodiments, it is possible to obtain an electron emission source of linear or planar form by the on-off control of light irradiating the P-type semiconductor areas and/or the on-off control of the applied voltage V.

As detailedly explained in the foregoing, the electron emission element of the present embodiment can achieve electron emission control with light such as a photoswitching. Because of an extremely simple structure composed solely of a P-type semiconductor area and electrodes and irradiated through the transparent electrode, it enables easy manufacture and high integration, and it is advantageously employed in a multiple electron emission element having plural P-type semiconductor areas.

More specifically, a linear or dot-shaped electron emission source can be obtained by forming plural P-type semiconductor areas explained above on a same transparent electrode, mutually insulating said semiconductor areas with insulating areas and forming an electrode on said semiconductor areas wherein the electron emission from each semiconductor area can be controlled by on-off control of said electrode or irradiating light. Also a dot-shaped, linear or planar electron emission source can be obtained by positioning said transparent electrodes and said electrodes in a matrix form, forming a P-type semiconductor area at each crossing point and mutually insulating said semiconductor areas with insulating areas, wherein the electron emission from each P-type semiconductor area can be controlled by the on-off control of said transparent electrodes and said electrodes, or by the on-off control of irradiating light.

Also it is possible to form a recess in said electrode and to form an area of a work function reducing material therein, thereby enabling electron emission at a lower energy and thus improving the efficiency of electron emission.

In the following there will be explained an eighth embodiment of the present invention, providing a photoswitchable electron emission element in which the amount of electrons emitted by an MIM electron emission element can be controlled with light and which enables a laminate structure and compact designing.

Figure 15:
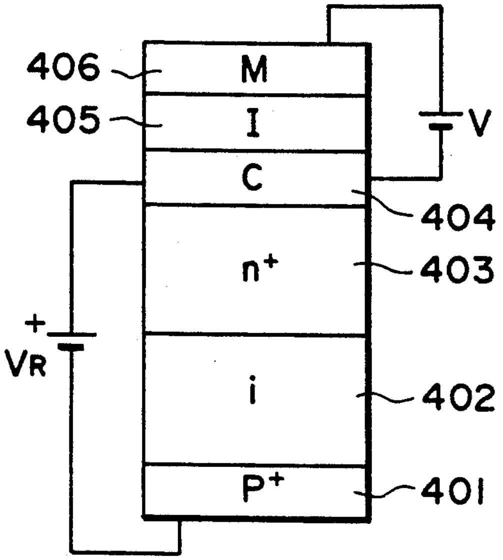
FIG. 15 is a schematic view of a photoswitchable electron emission element constituting an eighth embodiment of the present invention.

FIG. 15 is a schematic view of a photoswitchable electron emission element constituting an eighth embodiment of the present invention.

As shown in FIG. 15, the photoelectric converting junction element is PIN photodiode composed of a $P^+$-layer 401, an I-layer 402, and an $N^+$-layer 403. Because of the presence of the I-layer, the PIN photodiode can reduce the junction capacity and the running time of carriers in the depletion layer. On said PIN photodiode there is formed an electron emission element, composed of a conductive layer 404, an insulating layer 405 of a thickness of 30–100 Å formed thereon, and a metal layer 406 of a thickness of 10–100 Å formed on said insulating layer 405.

The conductive layer 404 is composed of a metal such as Al or a semiconductor such as Si. The insulating layer 405 is preferably composed, also from the standpoint of manufacture, of $Al_2O_3$ if the conductive layer is composed of Al, or of $SiO_2$ if the conductive layer is composed of Si. The metal layer 406 is composed of Al, Au or Pt.

In a photoswitchable electron emission element composed of the PIN photodiode and the electron emission element as explained above, an inverse bias voltage is applied between the $P^+$-layer 401 and the $N^+$-layer 403 to maintain the carrier generating area of the I-layer 402 at a low impurity level, to expand the depletion area and reduce the junction capacity. In such condition, the carriers are mostly generated in the depletion area and move by an electric field in said depletion area. By another voltage applied between the conductive area 404 and the metal layer 406, the carrier electrons generated by light absorption are injected into the conductive layer 404, accelerated and emitted from the metal layer 406, corresponding to the incident light.

Figure 16:
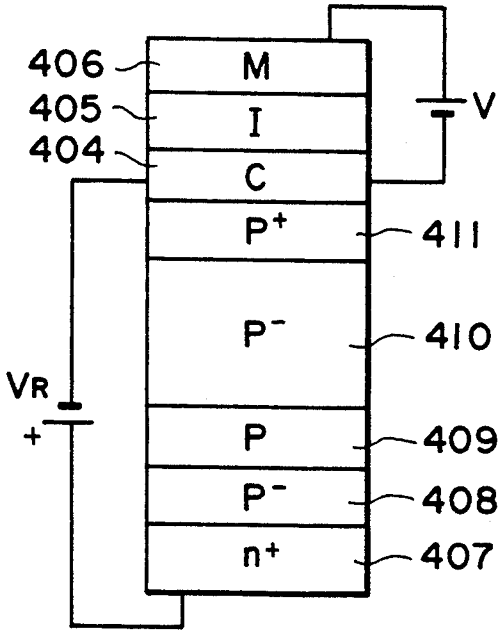
FIG. 16 is a schematic view of a photoswitchable electron emission element constituting a ninth embodiment of the present invention.

FIG. 16 is a schematic view of a photoswitchable electron emission element constituting a ninth embodiment of the present invention, wherein the electron emission element is same as that in the eighth embodiment and will not therefore be explained further.

As shown in FIG. 16, the photoelectric converting junction element in the present embodiment is an avalanche photodiode composed of an N+-layer 407, a P−-layer 408, a P-layer 409, a P−-layer 410 and a P+-layer 411. In addition to the high-speed performance of PIN diode, the avalanche diode is featured by an internal amplification effect, wherein the electrons injected from the N+-layer 407 are accelerated by a strong electric field in the P−-layer 408 to cause an avalanche phenomenon, inducing electron multiplication.

On said avalanche photodiode there is formed an electron emission element mentioned above.

In a photoswitchable electron emission element composed of such avalanche photodiode and electron emission element, an inverse bias voltage $V_R$ is applied between the P+-layer 411 and the N+-layer 407 to form a depletion layer in the carrier generating area of the P−-layer 410. Then a voltage applied between the conductive layer 404 and the metal layer 406 injects the carrier electrons, generated by light absorption and multiplied by an avalanche phenomenon in the P−-layer 408, into the conductive layer 404, and thus injected electrons are accelerated and emitted from the metal layer 406, corresponding to the incident light.

As detailedly explained in the foregoing, the photoswitchable electron emission element of the present embodiment can emit electrons corresponding to the incident light, and is compact since the photoelectric converting junction element and the electron emission element can be unified in a laminate structure.

Also as said junction element, there may be employed a PIN photodiode for reducing the junction capacity due to the presence of an i-layer, and for reducing the running time of carriers in the depletion layer under a high voltage, and a high-speed photoswitchable electron emission element can thus be obtained.

Also as said junction element, there may be employed an avalanche photodiode to achieve internal amplification by electron multiplication through avalanche phenomenon, in addition to the above-mentioned high speed performance.

What is claimed is:

1. An electron emission device comprising:

an electron emitting element for emitting electrons and including a semiconductor body capable of generating photo-excited electrons, a pair of electrodes connected to said semiconductor body, an electron emitting surface and a light incident surface;

a light source; and a shutter element disposed between said light incident surface and said light source for regulating transmittance of a light incident on the light incident surface from the light source, so as to transmit light from said light source to said light incident surface and to shield said light incident surface from light irradiated by said light source, said shutter element being operated by an electric signal, wherein a voltage is applied between said electrodes and said semiconductor body is irradiated with light through said shutter element to emit the electrons from said electron emitting surface, based on the photo-excited electrons.

2. An electron emission device according to claim 1, wherein a plurality of said electron emitting elements are provided, and a plurality of said shutter elements are provided corresponding thereto.

3. An electron emission device according to claim 1, wherein the electrons generated in said semiconductor body are emitted through an electron emitting face at an end of said semiconductor body.

4. An electron emission device according to claim 3, wherein said pair of electrodes are provided with a recess in which an area of a work function reducing material is formed.

5. An electron emission device according to claim 3, wherein plural semiconductor bodies are formed on a same transparent electrode, and said electrodes are formed on said semiconductor bodies, and insulation areas are formed between neighboring semiconductor bodies.

6. An electron emission device according to claim 4, wherein plural semiconductor bodies are formed on a same transparent electrode, and said electrodes are formed on said semiconductor bodies, and insulation areas are formed between neighboring semiconductor bodies.

7. An electron emission device according to claim 3, wherein said electrodes are arranged in a matrix, and said semiconductor bodies are formed at the crossing points of said electrodes while insulating areas are formed between neighboring semiconductor bodies.

8. An electron emission device according to claim 4, wherein said electrodes are arranged in a matrix, and said semiconductor bodies are formed at the crossing points of said electrodes while insulating areas are formed between neighboring semiconductor bodies.

9. An electron emission device comprising:

a photoelectric converting element including a first semiconductor region of a first conductivity type and a second semiconductor region of a second conductivity type different from the first conductivity type;

an electron emitting element being contiguous to said photoelectric converting element and having a conductive layer, a metallic layer and an insulating layer disposed therebetween;

means for applying a voltage between said conductive layer and said metallic layer; and means for applying a reverse bias voltage to said photoelectric converting element, wherein the voltage and the reverse bias voltage are applied and said photoelectric converting element is irradiated with light to emit electrons from said electron emitting element, and wherein a side surface of said photoelectric converting element is covered with an insulator of the insulating layer of the electron emitting element.

10. A electron emission device according to claim 9, wherein said photoelectric converting element is a PIN photodiode.

11. A electron emission device according to claim 9, wherein said photoelectric converting element is an avalanche photodiode.

12. An electron emission device according to claim 1, wherein said shutter comprises a liquid crystal.

* * * * *

UNITED STATES PATENT AND TRADEMARK OFFICE
CERTIFICATE OF CORRECTION

PATENT NO. : 5,304,815

DATED : April 19, 1994

INVENTOR(S) : AKIRA SUZUKI ET AL.

It is certified that error appears in the above-identified patent and that said Letters Patent is hereby corrected as shown below:

ON THE TITLE PAGE,
AT [56] REFERENCES CITED

U.S. Patent Documents,
"O→Keefe" should read --O'Keefe-- and
"von Gorkom et al." should read --van Gorkom et al.--.

Other Publications,
"vaon" should read --von--.

COLUMN 1

Line 5, "abandoned" should read --abandoned,--.
Line 7, "Oct. 11, 1990" should read --Oct. 11, 1990,--.
Line 9, "abandoned" should read --abandoned,--.
Line 10, "Sep. 9, 1987" should read --Sep. 9, 1987,--.

COLUMN 2

Line 49, "dot shaped" should read --dot-shaped--.

COLUMN 3

Line 17, "reducing" should read --reducing the--.
Line 49, "photo exciting" should read --photo-exciting--.
Line 50, "to" should read --to a--.

UNITED STATES PATENT AND TRADEMARK OFFICE

CERTIFICATE OF CORRECTION

PATENT NO. : 5,304,815

DATED : April 19, 1994

INVENTOR(S) : AKIRA SUZUKI ET AL.

It is certified that error appears in the above-identified patent and that said Letters Patent is hereby corrected as shown below:

COLUMN 5

Line 25, "example there are" should read --example, there is--.

COLUMN 6

Line 68, "structure," should read --structure.--.

COLUMN 7

Line 47, "same" should read --the same--.

COLUMN 8

Line 17, "quires" should read --quire--.

COLUMN 10

Line 13, "Pn junction" should read --PN junction--.
Line 50, "aperture" should read --aperture.--.

UNITED STATES PATENT AND TRADEMARK OFFICE

CERTIFICATE OF CORRECTION

PATENT NO. : 5,304,815

DATED : April 19, 1994

INVENTOR(S) : AKIRA SUZUKI ET AL.

It is certified that error appears in the above-identified patent and that said Letters Patent is hereby corrected as shown below:

COLUMN 14

Line 58, "A" should read --An--.
Line 61, "A" should read --An--.

Signed and Sealed this

Twenty-fifth Day of October, 1994

Attest:

Bruce Lehman

BRUCE LEHMAN

*Attesting Officer*

*Commissioner of Patents and Trademarks*